(12) United States Patent
Lai

(10) Patent No.: US 9,379,131 B2
(45) Date of Patent: Jun. 28, 2016

(54) THREE DIMENSIONAL STACKED SEMICONDUCTOR STRUCTURE AND METHOD FOR MANUFACTURING THE SAME

(71) Applicant: MACRONIX INTERNATIONAL CO., LTD., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/506,791

(22) Filed: Oct. 6, 2014

(65) Prior Publication Data

US 2016/0099255 A1  Apr. 7, 2016

(51) Int. Cl.
| | |
|---|---|
| *H01L 27/115* | (2006.01) |
| *H01L 23/528* | (2006.01) |
| *G11C 16/04* | (2006.01) |
| *G11C 16/34* | (2006.01) |
| *H01L 29/66* | (2006.01) |

(52) U.S. Cl.
CPC ...... *H01L 27/11582* (2013.01); *G11C 16/0466* (2013.01); *G11C 16/3418* (2013.01); *H01L 23/528* (2013.01); *H01L 29/66833* (2013.01); *H01L 27/11578* (2013.01)

(58) Field of Classification Search
CPC ............. H01L 29/66833; H01L 27/11578; H01L 27/11582; H01L 29/7926; G11C 16/3418; G11C 16/0466

USPC ............... 257/321, 324, E29.309, E21.409
See application file for complete search history.

(56) References Cited

U.S. PATENT DOCUMENTS

| | | | | |
|---|---|---|---|---|
| 2009/0278193 | A1* | 11/2009 | Murata ............. | H01L 27/11551 257/324 |
| 2012/0182808 | A1* | 7/2012 | Lue .................... | G11C 16/0466 365/185 |

* cited by examiner

*Primary Examiner* — Evan Pert
*Assistant Examiner* — Changhyun Yi
(74) *Attorney, Agent, or Firm* — McClure, Qualey & Rodack, LLP

(57) ABSTRACT

A 3D stacked semiconductor structure is provided, comprising a plurality of multi-layered pillars formed on a substrate and spaced apart from each other, a plurality of first conductors formed between the adjacent multi-layered pillars, a plurality of charging-trapping layers formed on the substrate and on the sidewalls of the multi-layered pillars for separating the first conductor and the multi-layered pillars, and a second conductor formed on the first conductors and on the charging-trapping layers. One of the multi-layered pillars comprises a plurality of insulating layers and a plurality of conductive layers arranged alternately. The top surfaces of the first conductors are higher than the top surfaces of the multi-layered pillars so as to create a plurality of receiving trenches respectively on the multi-layered pillars. The second conductor fills up the receiving trenches on the multi-layered pillars.

12 Claims, 15 Drawing Sheets

THREE DIMENSIONAL STACKED SEMICONDUCTOR STRUCTURE AND METHOD FOR MANUFACTURING THE SAME

BACKGROUND

1. Field of the Invention

The disclosure relates in general to a three-dimensional (3D) stacked semiconductor structure and method of manufacturing the same, and more particularly to the 3D stacked semiconductor structure manufactured by self-aligned process.

2. Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable NAND-type flash memory structures have been proposed. However, the typical 3D memory structure suffers from several problems.

FIG. 1A~FIG. 1C illustrate a conventional method of manufacturing a 3D stacked semiconductor structure, for example, a 3D VG (vertical gate) NAND memory array structure. The conventional 3D stacked semiconductor structure includes several multi-layered pillars 11M formed on a substrate 10 and spaced apart from each other, and one of the multi-layered pillars 11M comprises a plurality of insulating layers (i.e. including a top insulating layer 111T, a bottom insulating layer 111B and several insulating layers 111 between the top and bottom insulating layers) and a plurality of conductive layers 121 arranged alternately. In the conventional method, the top conductor (such as polysilicon) is etched twice, i.e. poly-contact (PLC) process and poly-alignment (PLA) process. As shown in FIG. 1A, the PLC process is performed to form the patterned conductor 171 and several holes 171a, wherein the holes 171a expose the top surface of the substrate 10. As shown in FIG. 1B, the PLA process is performed by covering the structure on the substrate 10 of FIG. 1A, followed by forming the photo mask 182 for patterning the patterned conductor 171. As shown in FIG. 1C, the patterned conductor 171 of FIG. 1A is further etched to form the conductive blocks 19, wherein each conductive block 19 comprises a lower portion 19a (vertical to the substrate 10 along the y-direction) between the charging-trapping layers (vertical channels) 16 of the adjacent multi-layered pillars 11M, and an upper portion 19b connected to the lower portion 19a and extended along the x-direction as a word line.

According to the conventional method, the upper portion 19b (top PL conductor) is formed by twice etching. The PLA process of the conventional method is a not self-aligned process. Conductor-PL is remained for WL connection currently, and the PLA process has narrow process window due to non-self aligned process. Worse WL connection would be occurred due to twice etching processes (i.e. PLC process+ PLA process). Non-self-aligned SSL cut is conducted to form the SSL (string select line) islands, so that the morphology of SSL islands would be worse. Also, in the conventional method, the upper portion 19b and the lower portion 19a of each conductive block 19 are made from the same material, which can not satisfy the different requirements of the WLs (i.e. the upper portion 19b) and the gate material (i.e. the lower portion 19a, the conductor between the charging-trapping layers 16).

SUMMARY

The disclosure relates to a three-dimensional (3D) stacked semiconductor structure and method of manufacturing the structure using self-aligned process. Therefore, the 3D stacked semiconductor structure of the embodiment possesses self-aligned configurations of related elements, reduced resistance of word lines, and reliable electrical characteristics.

According to one embodiment of the present disclosure, a 3D stacked semiconductor structure is provided, comprising a plurality of multi-layered pillars formed on a substrate and spaced apart from each other, a plurality of first conductors formed between the adjacent multi-layered pillars, a plurality of charging-trapping layers formed on the substrate and on the sidewalls of the multi-layered pillars for separating the first conductor and the multi-layered pillars, and a second conductor formed on the first conductors and on the charging-trapping layers. In the embodiment, one of the multi-layered pillars comprises a plurality of insulating layers and a plurality of conductive layers arranged alternately. The top surfaces of the first conductors are higher than the top surfaces of the multi-layered pillars so as to create a plurality of receiving trenches respectively on the multi-layered pillars. The second conductor formed on the first conductors and on the charging-trapping layers fills up the receiving trenches on the multi-layered pillars.

According to one embodiment of the present disclosure, a method of forming 3D stacked semiconductor structure is provided, comprising steps of:

forming a plurality of multi-layered pillars on a substrate and spaced apart from each other, wherein one of the multi-layered pillars comprises a plurality of insulating layers and a plurality of conductive layers arranged alternately;

forming a plurality of charging-trapping layers on the substrate and on the sidewalls of the multi-layered pillars;

forming a plurality of first conductors between the adjacent multi-layered pillars, and the charging-trapping layers separating the first conductor and the multi-layered pillars, wherein top surfaces of the first conductors are higher than top surfaces of the multi-layered pillars so as to create a plurality of receiving trenches respectively on the multi-layered pillars; and forming a second conductor on the first conductors and on the charging-trapping layers, and the second conductor filling up the receiving trenches on the multi-layered pillars.

The disclosure will become apparent from the following detailed description of the preferred but non-limiting embodiments. The following description is made with reference to the accompanying drawings.

BRIEF DESCRIPTION OF THE DRAWINGS

FIG. 2A~FIG. 10A illustrate a method for manufacturing a 3D stacked semiconductor structure according to one embodiment of the present disclosure.

FIG. 2B~FIG. 7B and FIG. 10B illustrate cross-sectional views along the cross-sectional lines AA of FIG. 2A~FIG. 7A and FIG. 10A, respectively.

FIG. 4C~FIG. 7C and FIG. 10C illustrate cross-sectional views along the cross-sectional lines BB of FIG. 4A~FIG. 7A and FIG. 10A, respectively.

DETAILED DESCRIPTION

Figure 1A:
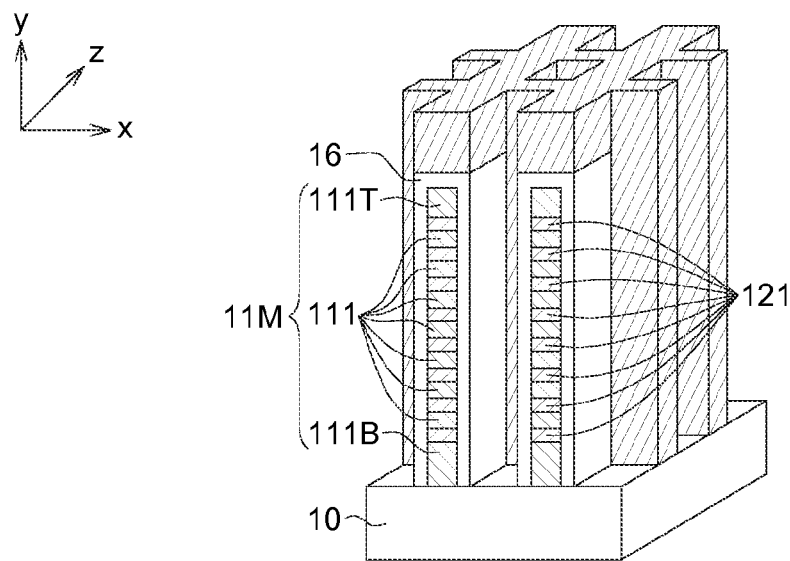
FIG. 1A~FIG. 1C (prior art) illustrate a conventional method of manufacturing a 3D stacked semiconductor structure.
Figure 1B:
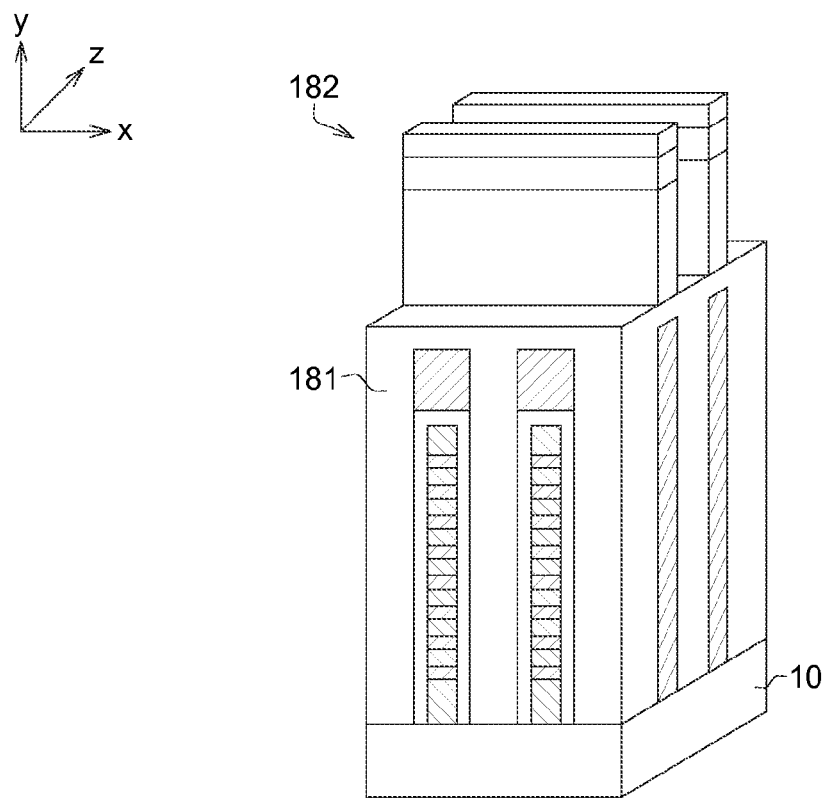
Figure 1C:
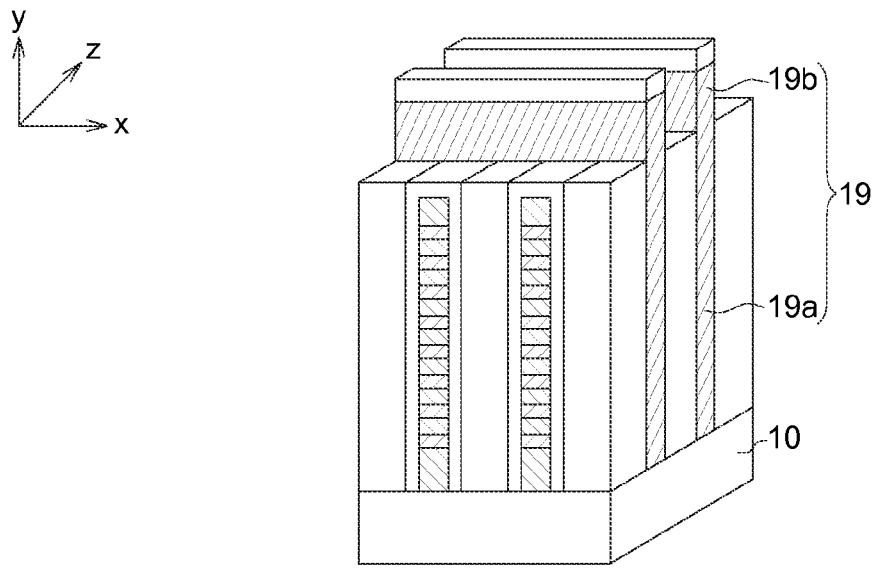

In the embodiments of the present disclosure, a three-dimensional (3D) stacked semiconductor structure and method of manufacturing the same are provided. The 3D stacked semiconductor structure of the embodiment can be manufactured by damascene WL process, which uses a self-aligned process to form word lines. According to the embodiment, it is possible to form the gates and word lines by using two different materials, so that the material of the gates has adequate work-function (ex: high work-function), and the other material of the word lines has lower resistance. Also, self-aligned double gate SSL process by BL isolation is performed. Accordingly, the 3D stacked semiconductor structure of the embodiment possesses advantages such as self-aligned configurations of related elements, reduced resistance of word lines, and reliable electrical characteristics. Also, the 3D stacked semiconductor structure of the embodiments are manufactured by simple process, and adopting no time-consuming and expensive procedures.

The embodiments are provided hereinafter with reference to the accompanying drawings for elaborating the 3D stacked semiconductor structures of the disclosure and method of manufacturing the same. However, the present disclosure is not limited thereto. The descriptions disclosed in the embodiments of the disclosure such as detailed structures, manufacturing procedures and material selections are for illustration only, not for limiting the scope of protection of the disclosure. Also, it is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

FIG. 2A~FIG. 10A illustrate a method for manufacturing a 3D stacked semiconductor structure according to one embodiment of the present disclosure. FIG. 2A~FIG. 10A show the top views of the 3D stacked semiconductor structure. Also, FIG. 2B~FIG. 7B and FIG. 10B illustrate cross-sectional views along the cross-sectional lines AA of FIG. 2A~FIG. 7A and FIG. 10A, respectively. FIG. 4C~FIG. 7C and FIG. 10C illustrate cross-sectional views along the cross-sectional lines BB of FIG. 4A~FIG. 7A and FIG. 10A, respectively. FIG. 8B, FIG. 9B and FIG. 10D illustrate cross-sectional views along the cross-sectional lines CC of FIG. 8A, FIG. 9A and FIG. 10A, respectively. In the exemplified embodiment, the position of the cross-sectional line AA is corresponding to a word line region, the position of the cross-sectional line BB is corresponding to a region between two word lines, and the position of the cross-sectional line CC is corresponding to a SSL region.

Figure 2A:
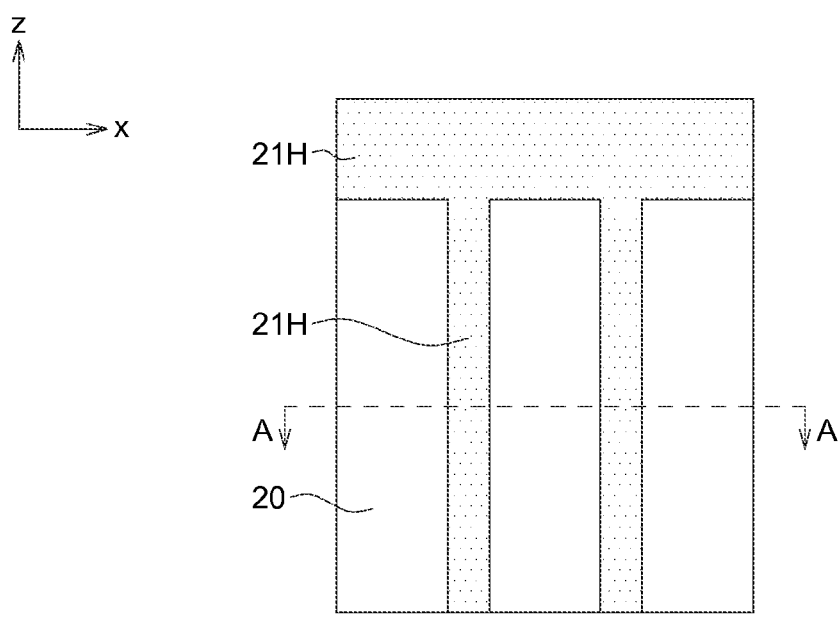
Figure 2B:
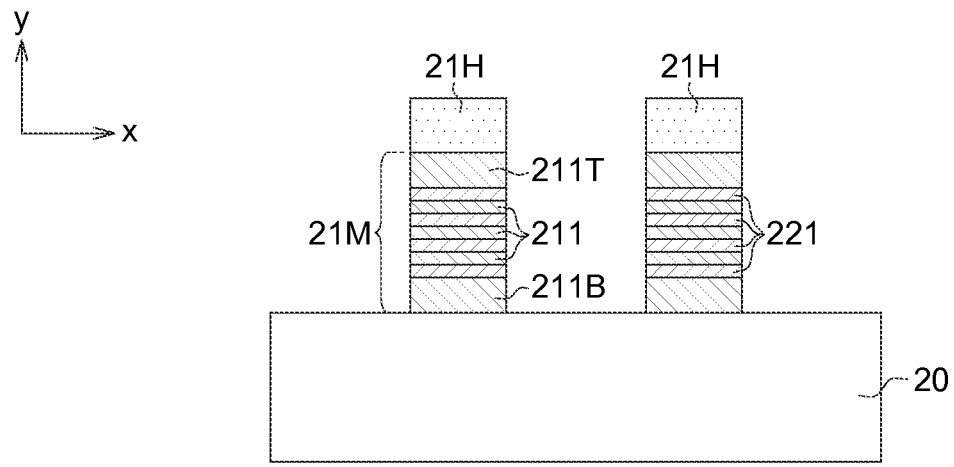

As shown in FIG. 2A and FIG. 2B, a plurality of multi-layered pillars 21M are formed on a substrate 20 and spaced apart from each other, and one of the multi-layered pillars 21M comprises a plurality of insulating layers (i.e. including a top insulating layer 211T, a bottom insulating layer 211B and several insulating layers 211 between the top and bottom insulating layers) and a plurality of conductive layers 221 (such as polysilicon layers) arranged alternately. A first insulator (as the hard mask) 21H is formed on the top insulating layer 211 of each of the multi-layered pillar 21M. In one embodiment, material of the first insulator 21H can be silicon nitride (SiN). The compressive stress from the multi-layered pillar 21M (ex: the oxide-poly stack) can be compensated by the tensile SiN film, and the SiN film to be the first insulator 21H (as the hard mask of the bit line) can prevent the bit lines from collapse or bending during manufacturing process.

Figure 3A:
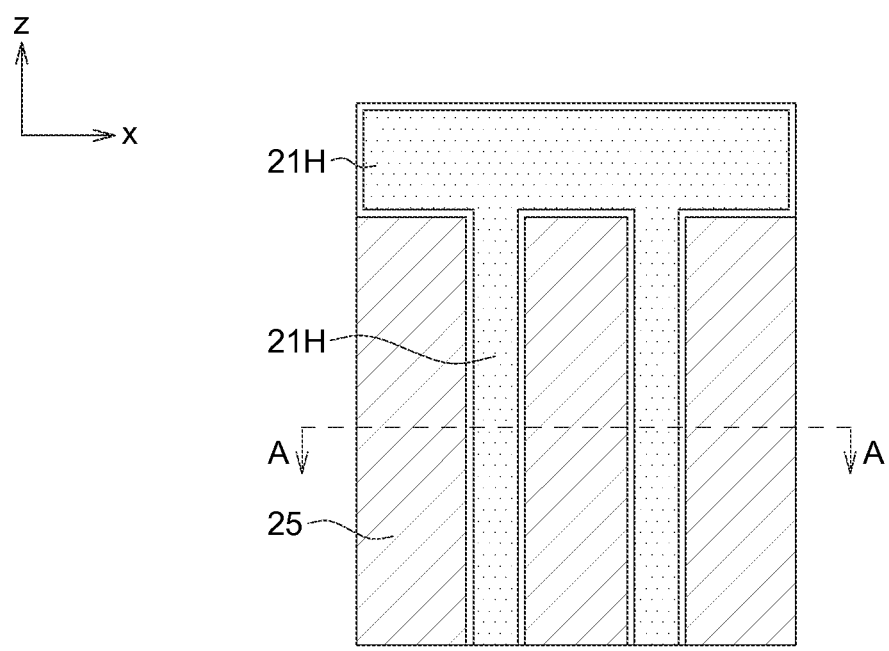
Figure 3B:
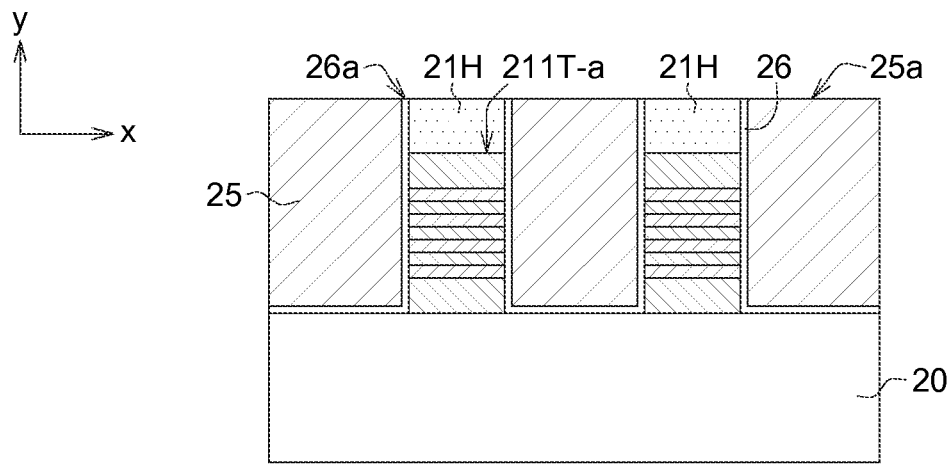

As shown in FIG. 3A and FIG. 3B, the charging-trapping layers 26 are formed on the substrate 20 and on the sidewalls of the multi-layered pillars 21M. In one embodiment, a charging-trapping film (such as ONO or ONONO) is deposited to cover the substrate 10 and the first insulators 21H. Then, a conductive layer (such as polysilicon, or P+ polysilicon, or other material having high work-function) is deposited on the first insulators 21H to fill spaces between the multi-layered pillars 21M after forming the charging-trapping film. Then, the conductive layer is planarized, such as by chemical mechanical polishing (CMP) or other suitable procedures, to expose the top surfaces 21H-a of the first insulators 21H and form the conductive strips 25 between the adjacent multi-layered pillars 21M. Accordingly, the top surfaces 21H-a of the first insulators 21H are uncover by the charging-trapping layers 26, as shown in FIG. 3A and FIG. 3B.

Figure 4A:
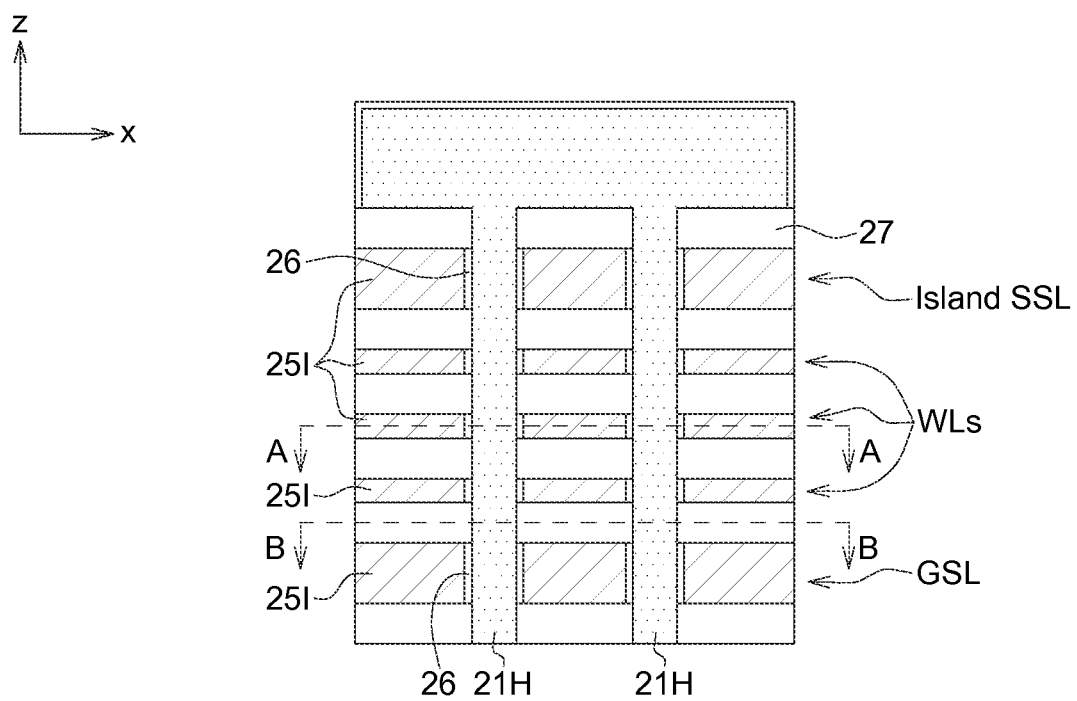
Figure 4B:
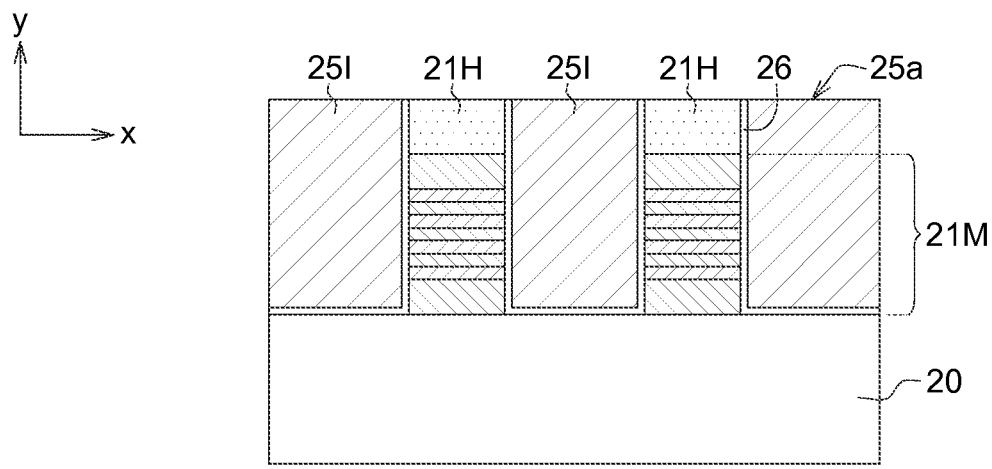
Figure 4C:
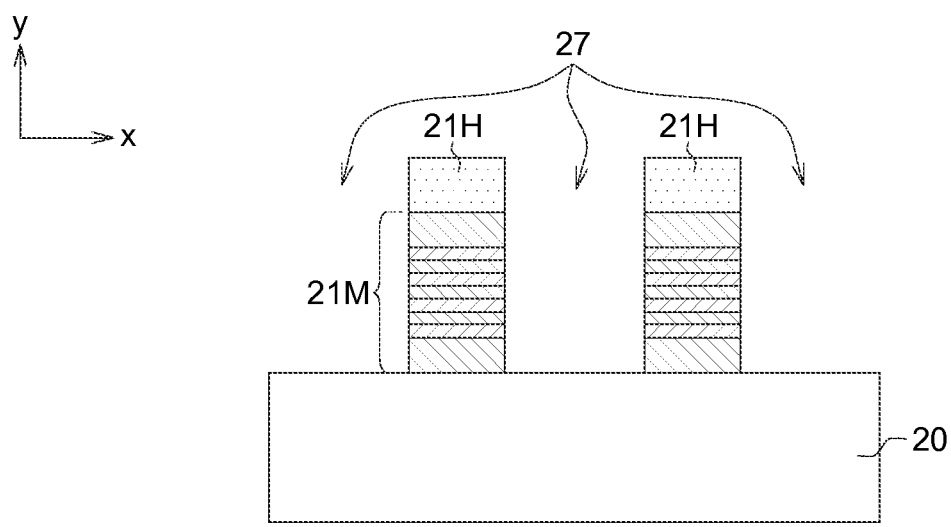

As shown in FIG. 4A, FIG. 4B and FIG. 4C, a plurality of holes 27 are formed to penetrate the conductive strips 25, wherein the holes 27 are spaced apart from each other. In one embodiment, the multi-layered pillars 21M are vertical to the substrate 20 along the y-direction, and positions of the holes 27 are arranged in a form of matrix on the xz-plane, as shown in FIG. 4A. In FIG. 4A, three word line regions (WLs), a SSL region (comprising SSL islands) and a GSL region extended along the x-direction are exemplified as a semiconductor structure of one embodiment.

Figure 5A:
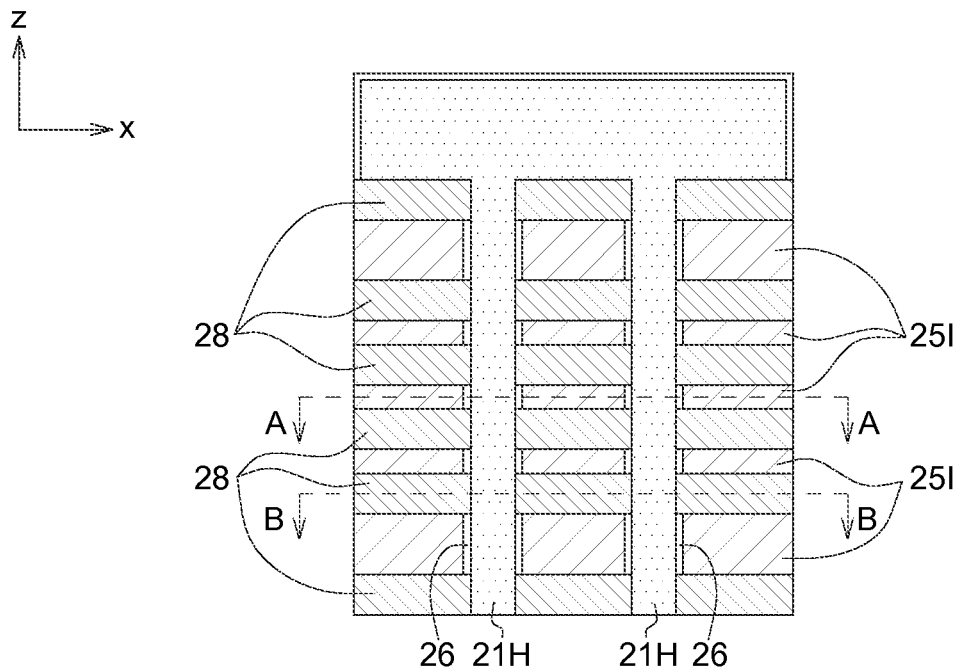
Figure 5B:
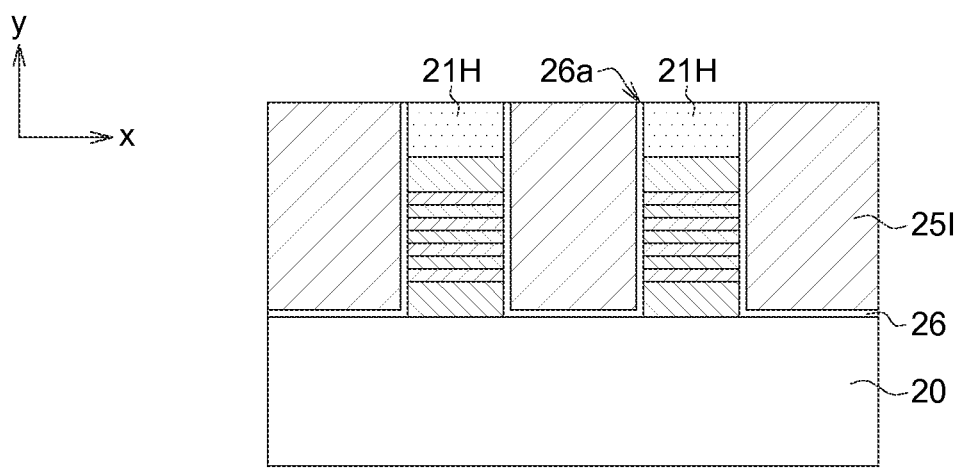
Figure 5C:
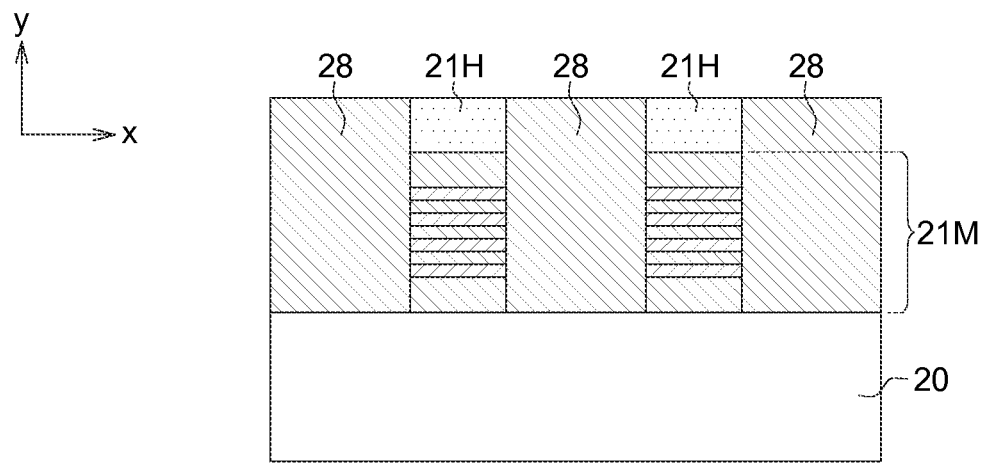

As shown in FIG. 5A, FIG. 5B and FIG. 5C, the holes 27 are filled with insulating material (such as oxide) to form the insulating islands 28. Accordingly, each of the conductive strips 25 of FIG. 3A is now divided into the first conductors 25I by the insulating islands 28. In FIG. 5A, the first conductors 25I along the first direction (ex: x-direction) are formed between the adjacent multi-layered pillars 21M, and the first conductors 25I along the third direction (ex: z-direction) are isolated from each other by the insulating islands 28 and the charging-trapping layers 26. In one embodiment, as shown in the top view of FIG. 5A, the first conductors 25I are positioned slightly behind the boundaries of the insulating islands 28 (ex: oxide), and the charging-trapping layers 26 on the sidewalls of the multi-layered pillars 21M are positioned between the adjacent insulating islands 28 along the third direction (ex: z-direction).

Figure 6A:
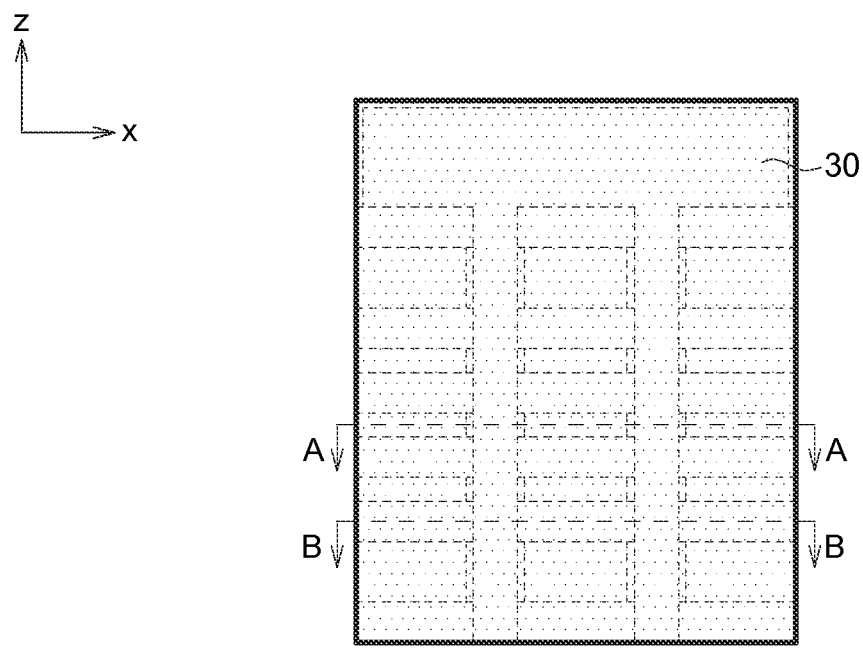
Figure 6B:
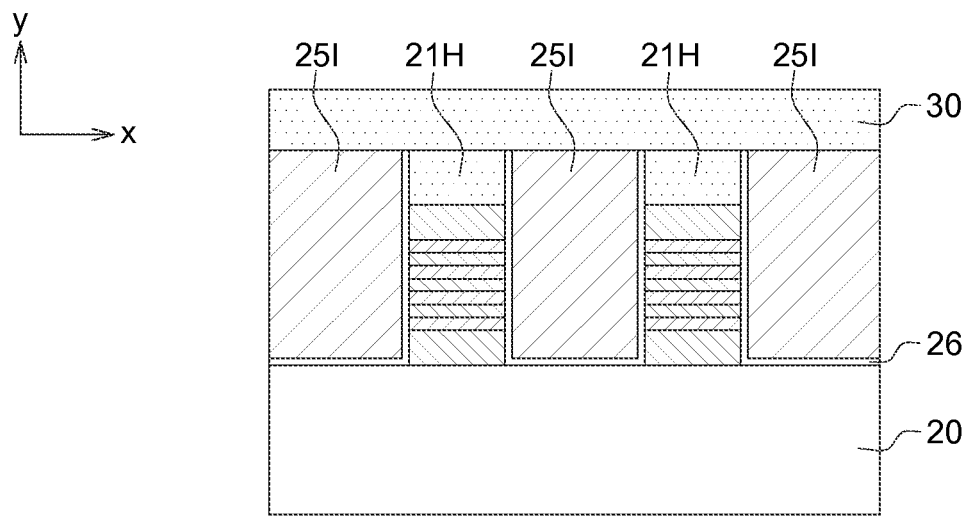
Figure 6C:
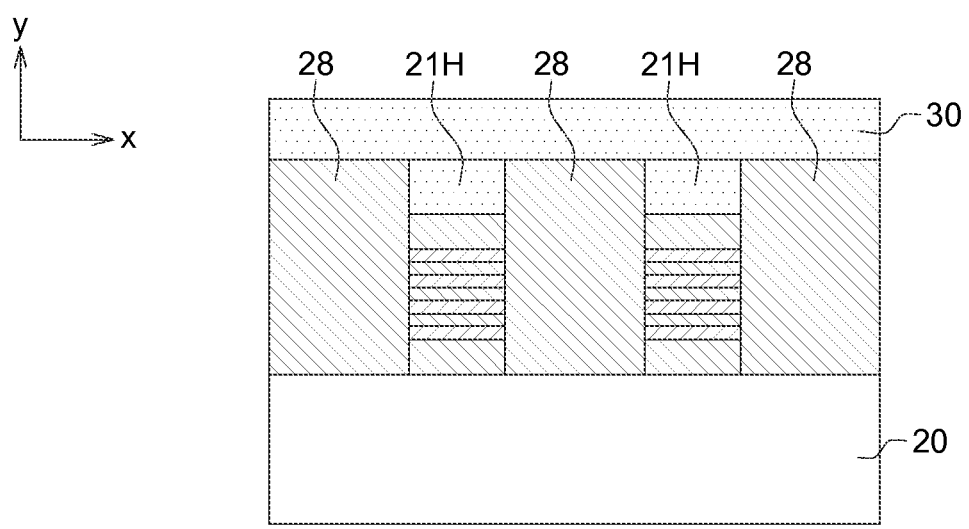

As shown in FIG. 6A, FIG. 6B and FIG. 6C, an insulation blanket 30 is formed to cover the first conductors 25I, the insulating islands 28, the charging-trapping layers 26 and the first insulators 21H. In one embodiment, the insulation blanket 30 and the first insulators 21H are made from the same material, such as SiN.

Figure 7A:
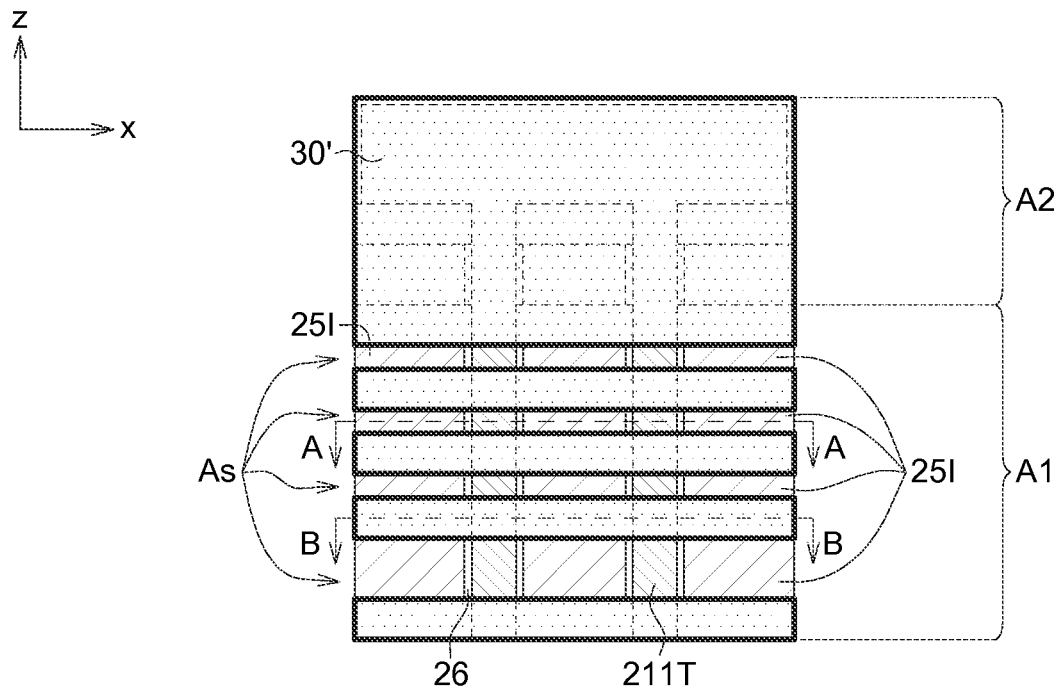
Figure 7B:
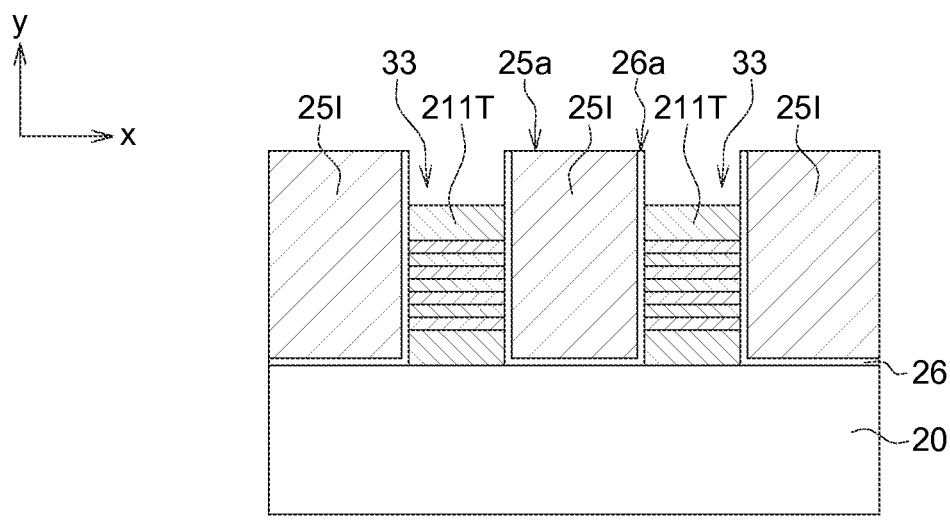
Figure 7C:
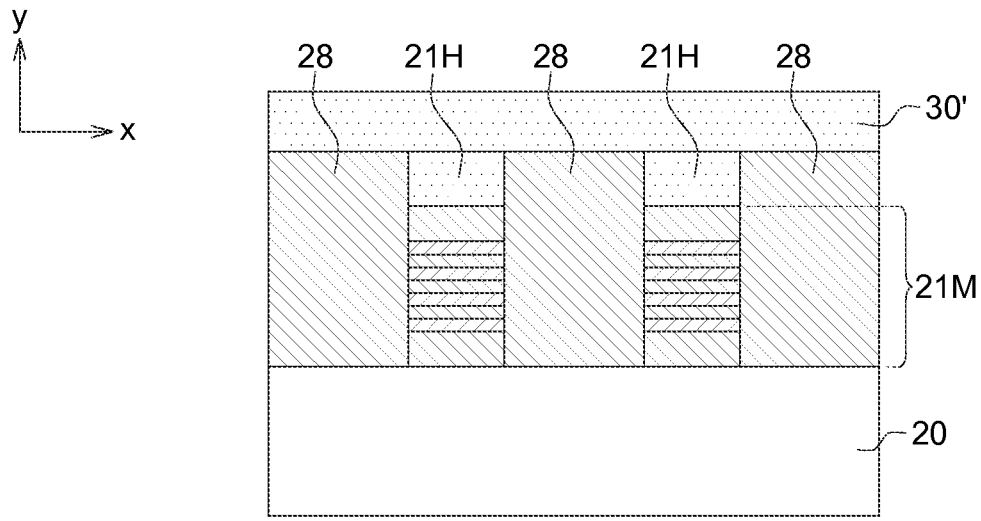

As shown in FIG. 7A, FIG. 7B and FIG. 7C, part of the insulation blanket 30 in the first region A1 (ex: array region) of the substrate 10 (having the first region A1 and the second region A2) is removed, to form a patterned insulation blanket 30' and a plurality of stripe areas As extended along the first direction (ex: x-direction). The stripe areas As are apart from each other. In the embodiment of using the same material (such as SiN) for forming the insulation blanket 30 and the first insulators 21H, parts of the first insulators 21H corresponding to the stripe areas As are also removed simultaneously (to expose the top insulating layers 211T beneath). In one embodiment exemplified in FIG. 7A, each of the stripe areas As exposes the top surfaces 25a of the first conductors 25I, the top insulating layers 211T of the multi-layered pillars 21M and the top surfaces 26a of the charging-trapping layers 26, so as to form the receiving trenches 33 respectively on the multi-layered pillars 21M in the first region A1.

Figure 8A:
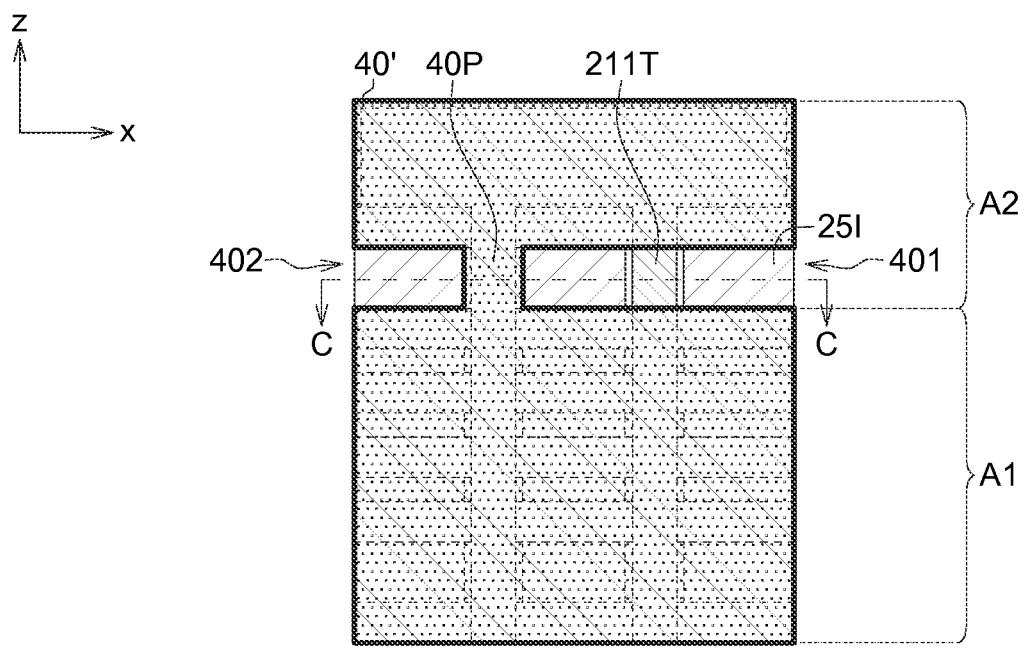
Figure 8B:
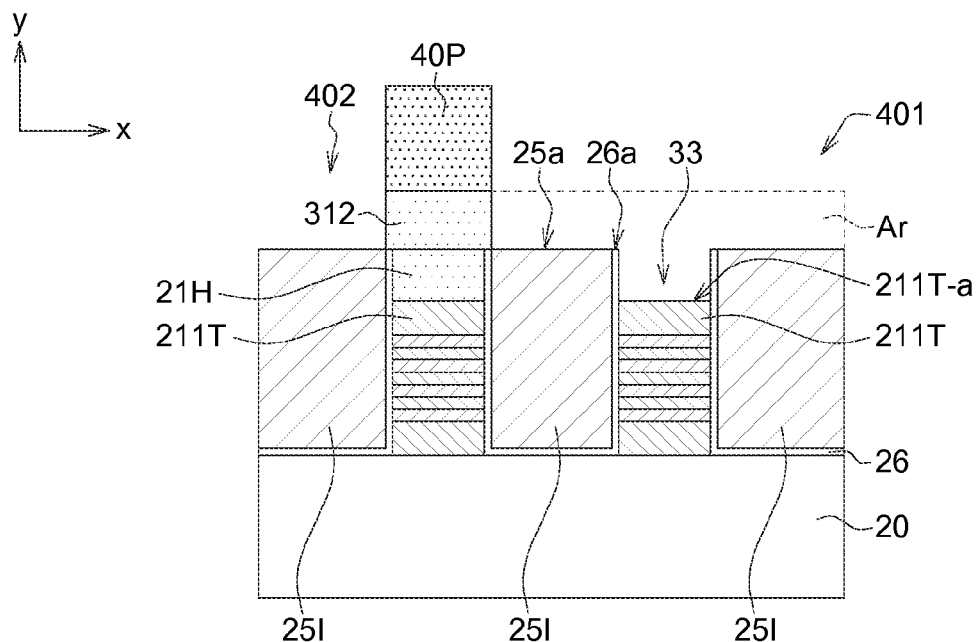
FIG. 8B, FIG. 9B and FIG. 10D illustrate cross-sectional views along the cross-sectional lines CC of FIG. 8A, FIG. 9A and FIG. 10A, respectively.

Afterwards, the patterned insulation blanket 30' corresponding to the SSL region may be further patterned (such as by patterned photo-resist 40') to define the recessed regions Ar in a second region A2. In one embodiment, the second region A2 is a SSL region. As shown in FIG. 8A and FIG. 8B, a patterned photo-resist (PR) 40' is formed above the patterned insulation blanket 30', and the patterned photo-resist has openings (ex: 401 and 402) in the second region A2. In one embodiment, the openings 401 and 402 are arranged along the first direction (ex: x-direction), and the adjacent recessed regions Ar are separated by the patterned PR 40' stacked on the patterned insulation blanket 30' (also referred as the second insulators 312). Then, the patterned PR 40' is removed, as shown in FIG. 9A and FIG. 9B.

Figure 9A:
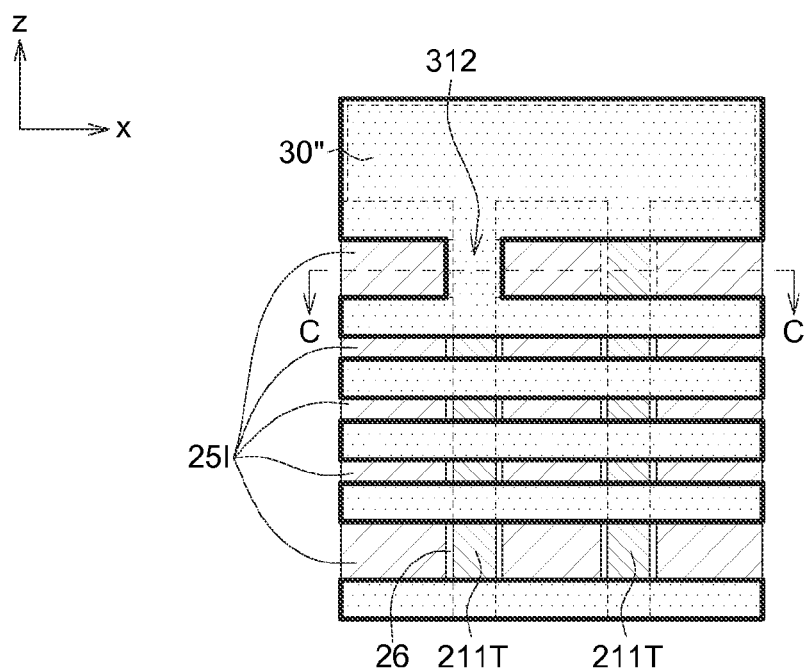
Figure 9B:
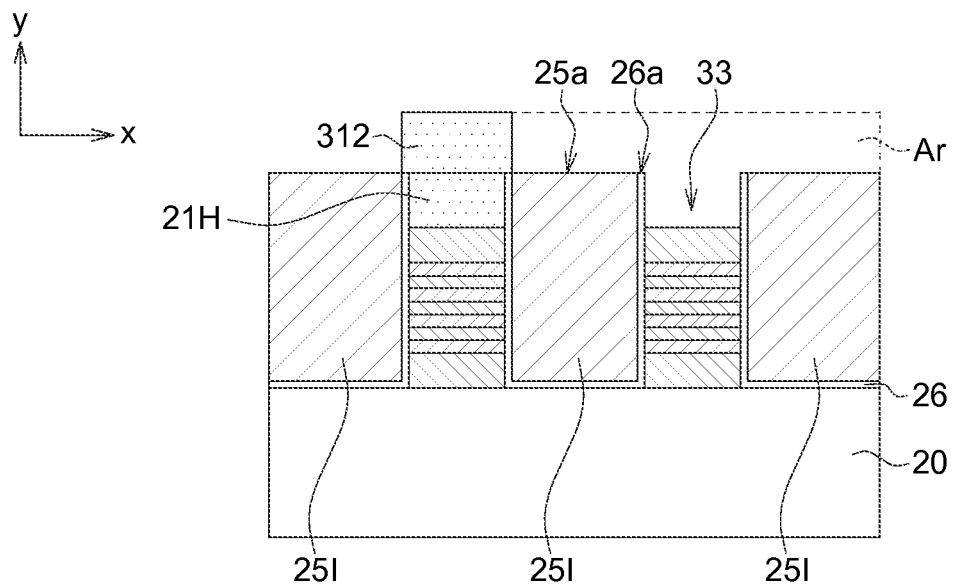

In FIG. 8B and FIG. 9B, the adjacent recessed regions Ar are separated from each other by the second insulators 312. In one embodiment, each of the recessed regions Ar includes one of the receiving trenches 33 on the corresponding multi-layered pillar 21M and the region above two first conductors 25I adjacent to the corresponding multi-layered pillar 21M. Accordingly, each of the recessed regions Ar exposes the top surfaces 25a of the first conductors 25I and the top surfaces 26a of the charging-trapping layers 26 adjacent to the corresponding multi-layered pillar 25M, and the top insulating layer 211 of the corresponding multi-layered pillar 25M, as shown in FIG. 9B. Although FIG. 8A, FIG. 8B, FIG. 9A and FIG. 9B shows one second insulator 312 stacked on the first insulators 21H, the second insulators of the embodied structures can be formed on the first insulators 21H on every other multi-layered pillars 21M (i.e. another set of the second insulator 312 stacked on the first insulators 21H and a recessed region Ar would repeatedly appear to the right hand side of FIG. 8B and FIG. 9B). Additionally, the second insulators 312 (insulation blanket 30/patterned insulation blanket 30') and the first insulators 21H of one embodiment are made from the same material (such as SiN), but different from the material of the insulating layers 211, 211T and 211B (such as oxide) of the multi-layered pillars 21M.

Afterwards, another conductive layer is deposited for filling the spaces as shown in FIG. 9A and FIG. 9B, followed by planarization (such as by CMP or other suitable procedures), to form a second conductor 52. As shown in FIG. 10A~FIG. 10D, a second conductor 52 is formed on the first conductors 25I and on the charging-trapping layers 26, so as to fill the receiving trenches 33 on the multi-layered pillars 25M in the first region A1 (to form the WLs) and the recessed regions Ar in the second region A2 (to form the SSL portions). In one embodiment, two of the adjacent SSL portions (the second conductor 52 in the recessed regions Ar) are electrically isolated by the second insulator 312, as shown in FIG. 10D. According to one embodied manufacturing method, the step of filling the second conductor 52 in the recessed regions Ar in the second region A2 and step of forming the second conductor 52 in the receiving trenches 33 on the multi-layered pillars 21M in the first region A1 are performed simultaneously.

Figure 10A:
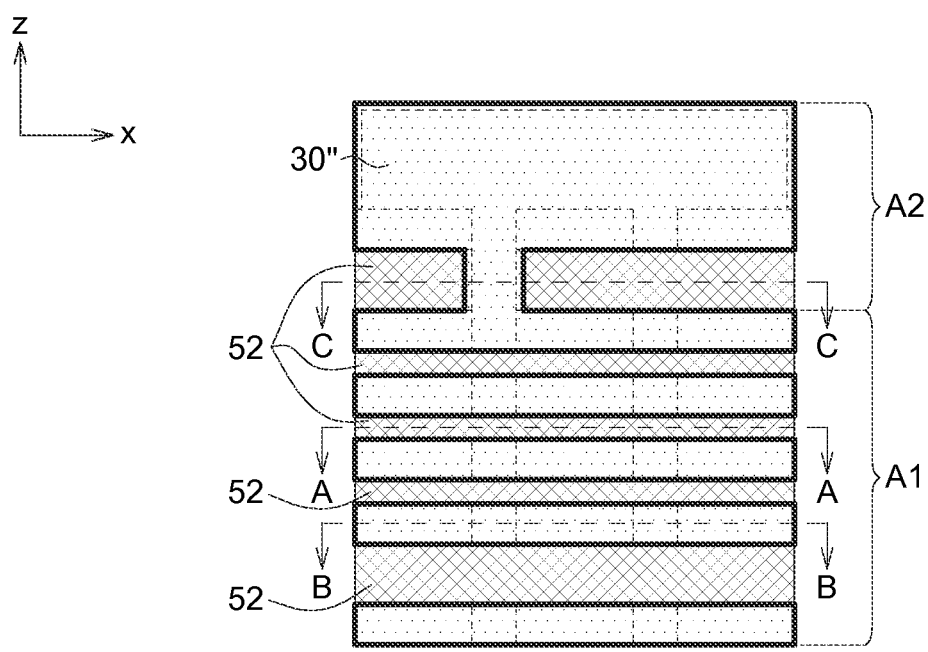
Figure 10B:
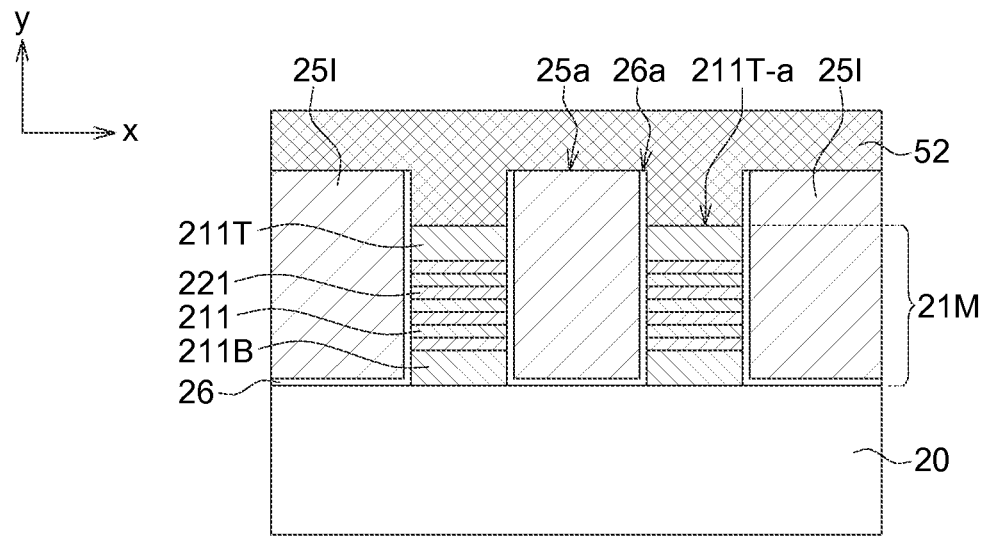
Figure 10C:
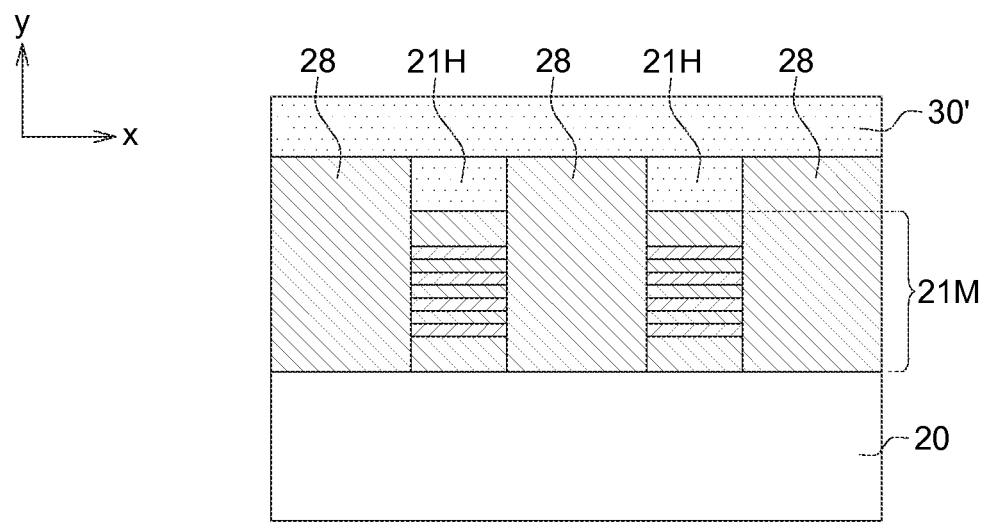
Figure 10D:
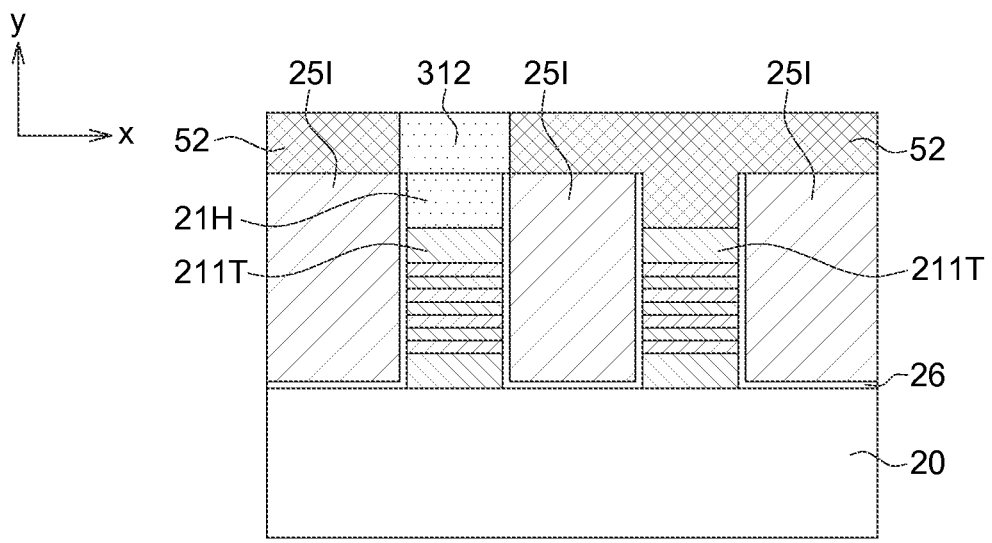

FIG. 10A~FIG. 10C also show the configurations of an array region of the 3D stacked semiconductor structure according to the embodiment of the disclosure, and FIG. 10D shows the configurations of a SSL region of the 3D stacked semiconductor structure according to the embodiment of the disclosure. As shown in FIG. 10A~FIG. 10D, the multi-layered pillars 21M are spaced apart from each other along the first direction (ex: x-direction) and stacked on the substrate 20 along the second direction (ex: y-direction), and further extended along the third direction (ex: z-direction). The first direction is perpendicular to the second and third directions, and the second direction is perpendicular to the third direction.

According to the embodiment, in the first region A1 (i.e. an array region), the 3D stacked semiconductor structure comprises a plurality of multi-layered pillars 21M formed on the substrate 20 and spaced apart from each other, several first conductors 25I (functioning as gate for VG NAND) formed between the adjacent multi-layered pillars 21M, the charging-trapping layers 26 (such as the U-shaped charging-trapping layers) formed on the substrate 20 and on the sidewalls of the multi-layered pillars 21M for separating the first conductor 25I and the multi-layered pillars 21M, and the second conductor 52 (extended along the x-direction functioning as WLs) formed on the first conductors 25I and on the charging-trapping layers 26 and the second conductor 52 filling up the receiving trenches 33 on the multi-layered pillars 21M. As shown in FIG. 10B, the top surfaces 25a of the first conductors 25I are higher than the top surfaces of the multi-layered pillars 21M, thereby creating the receiving trenches 33 respectively on the multi-layered pillars 21M. In other words, the top surfaces of the multi-layered pillars 21M (or the top surfaces 211T-a of the top insulating layers 211T of the multi-layered pillars 21M) are lower than the top surfaces 26a of the charging-trapping layers 26. In one embodiment, the top surfaces 26a of the charging-trapping layers 26 are substantially aligned with the top surfaces 25a of the first conductors 25I.

As shown in FIG. 10A and FIG. 10B, each of the multi-layered pillars 21M is separated from the adjacent first conductors 25I by the charging-trapping layers 26 (i.e. each of the first conductors 25I is separated from the adjacent multi-layered pillars 21M by one of U-shaped charging-trapping layers 26). According to the embodiment, the first conductors 25I and the second conductor 52 can be made from different conductive materials. For example, the first conductors 25I are made from a conductive material having high work function such as P+ poly or other suitable material for the applications, and the second conductor 52 is made from a conductive material with low resistance such as metal.

Accordingly, the 3D stacked semiconductor structure of the embodiment can be manufactured by damascene WL process, which uses a self-aligned process to form word lines. Also, the gates and word lines can be formed by using two different materials, wherein one material of the gates has adequate work-function (ex: high work-function), and the other material of the word lines has lower resistance, thereby increasing the electrical characteristics of the 3D stacked semiconductor structure.

Figure 11:
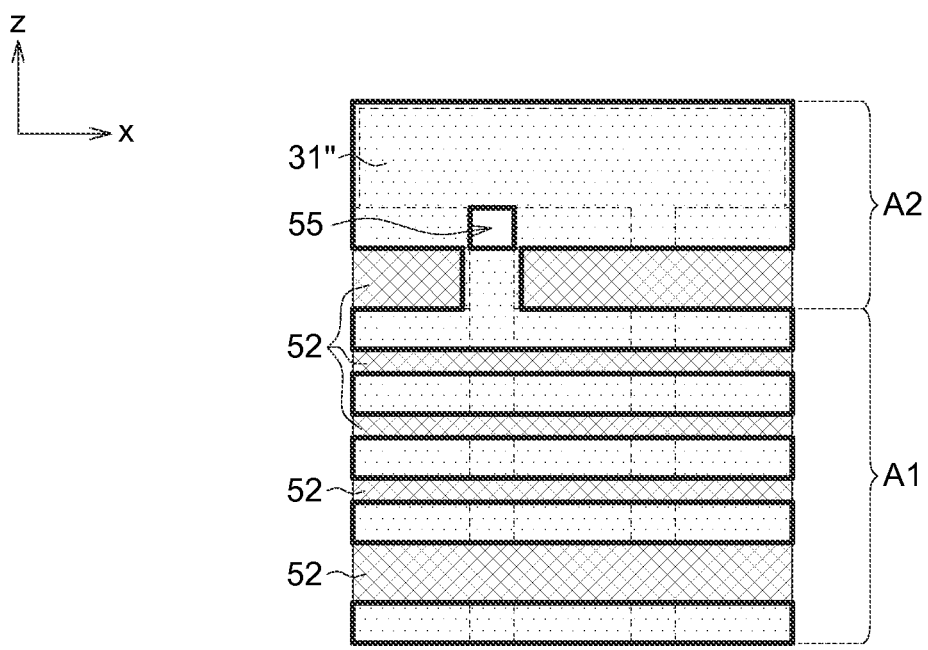
FIG. 11 depicts a top view of one 3D stacked semiconductor structures with a finger-type BL layout.

According to the embodiment, structural configuration in the second region A2 (such as a SSL region) of the 3D stacked semiconductor structure may be altered according to the semiconductor types in practical applications. FIG. 8A~FIG. 10A and FIG. 11 depict top views of one 3D stacked semiconductor structures with a finger-type BL layout. In FIG. 11 (with a SSL contact 55), a BL cut hole is formed followed by oxide fill-in to seal the BL cut hole to form a finger BL layout.

Figure 12A:
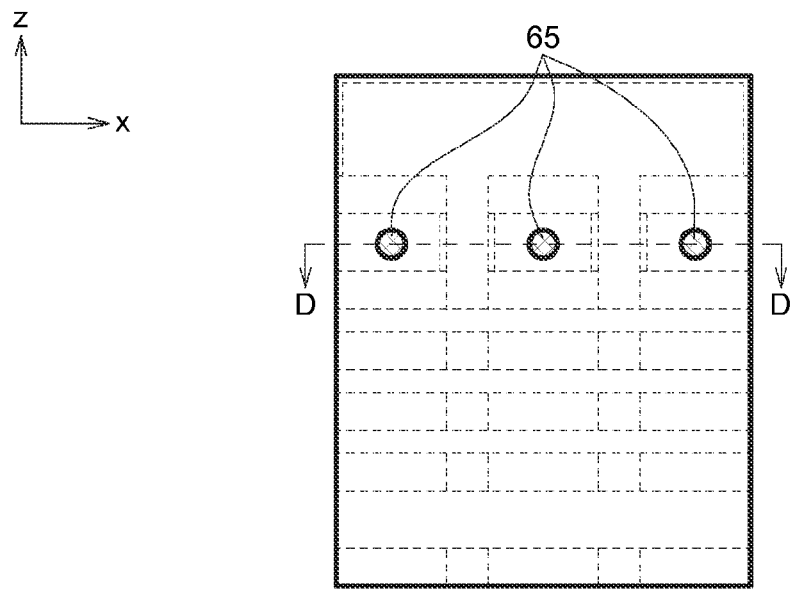
FIG. 12A shows a top view of one 3D stacked semiconductor structures with an IDG layout.
Figure 12B:
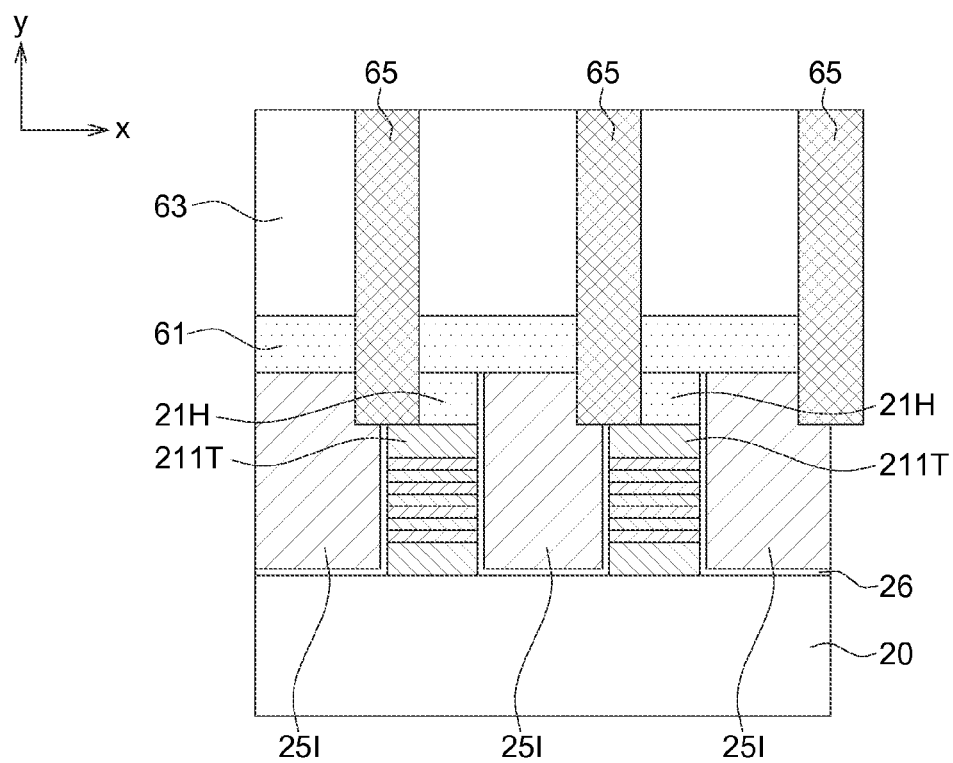
FIG. 12B illustrates a cross-sectional view along the cross-sectional lines DD of FIG. 12A.

FIG. 12A shows a top view of one 3D stacked semiconductor structures with an IDG layout. FIG. 12B illustrates a cross-sectional view along the cross-sectional lines DD of FIG. 12A. The IDG layout is also named as NAND string layout. The 3D stacked semiconductor structures with the IDG layout requires no SSL cut process, but needs one additional etch process (i.e. the SSL contact process) to form the SSL contacts 65. One of possible manufacturing processes is described below. As shown in FIG. 12B, the adjacent receiving trenches 33 on the multi-layered pillars 21M in the second region respectively are filled with the first insulators (as hard mask, HM) 21H, and a second insulator (such as SiN) 61 is formed on the first conductors 25I positioned between the multi-layered pillars 21M and on the first insulator 21H on the multi-layered pillars 21M in the SSL region. Also, a dielectric layer (such as IMD or ILD) 63 is formed on the second insulator 61, and the SSL contacts 65 are formed to penetrate through the dielectric layer 63, the second insulator 61 and the first insulator 21H, wherein each of the SSL contacts 65 connects one of the first conductors 25I and partially touch a top surface of the top insulating layer 211T of the multi-layered pillar 21M in the SSL region. By implementing borderless contact process, the SSL contact 65 will be stopped on the BL SiN HM (i.e. the first insulator 21H) or the BL top oxide (i.e. the top insulating layer 211T as shown in FIG. 12B). Since the SSL contacts 65 are not stopped on the top BL layers, the over-lay window will be larger.

According to the embodiment, the BL SiN HM (i.e. the first insulator 21H) has several advantages, such as serving as a tensile film to compensate oxide-poly compressive film (of the multi-layered pillars 21M) to prevent BL bending or collapse, serving as polysilicon (PL) hard mask during PL CMP, serving as trench during PLA & SSL cut etch to link WL and SSL as double gate. Also, the BL SiN HM provides a larger over-lay window for mis-aligned condition since SiN has higher selectivity to oxide (i.e. the insulating layers 211/211T/211B and the insulating islands 28) and polysilicon (i.e. one applicable material of the first conductors 25I).

According to the aforementioned description, the construction of the embodiment has several benefits. For island SSL, bit line functions as the isolation layer to form the self-aligned SSL, and linkage of SSL as double gate for finger BL layout is achieved by SSL cutting. Also, borderless SC (source contact) contact process is performed for the application with IDG BL layout. For finger BL layout, the finger BL layout is formed by cutting BL. Moreover, the 3D stacked semiconductor structure of the embodiment can be manufactured by damascene WL process, which uses a self-aligned process to form word lines. Also, it is possible to form the gates and word lines by using two different materials, so that the material of the gates has adequate work-function (ex: high work-function), and the other material of the word lines has lower resistance. Accordingly, the 3D stacked semiconductor structure of the embodiment possesses advantages such as self-aligned configurations of related elements, reduced resistance of word lines, and reliable electrical characteristics. Also, the 3D stacked semiconductor structure of the embodiment can be manufactured by simple and not expensive procedures, which is suitable for mass production.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) stacked semiconductor structure, comprising:
    a plurality of multi-layered pillars formed on a substrate and spaced apart from each other, and one of the multi-layered pillars comprising a plurality of insulating layers and a plurality of conductive layers arranged alternately;
    a plurality of first conductors formed between the adjacent multi-layered pillars, and top surfaces of the first conductors higher than top surfaces of the multi-layered pillars so as to create a plurality of receiving trenches respectively on the multi-layered pillars;
    a plurality of charging-trapping layers formed on the substrate and on the sidewalls of the multi-layered pillars for separating the first conductors and the multi-layered pillars; and
    a second conductor formed on the first conductors and on the charging-trapping layers, and filling up the receiving trenches on the multi-layered pillars, wherein the second conductor is extended along a first direction as a word line in a first region of the semiconductor structure.

2. The 3D stacked semiconductor structure according to claim 1, wherein said top surfaces of the multi-layered pillars are lower than top surfaces of the charging-trapping layers.

3. The 3D stacked semiconductor structure according to claim 1, wherein each of the multi-layered pillars is separated from the adjacent first conductors by the charging-trapping layers.

4. The 3D stacked semiconductor structure according to claim 1, wherein top surfaces of the charging-trapping layers are substantially aligned with said top surfaces of the first conductors.

5. The 3D stacked semiconductor structure according to claim 1, wherein the first conductors are made from a conductive material having high work function.

6. The 3D stacked semiconductor structure according to claim 1, wherein the second conductor is made from a conductive material with low resistance.

7. The 3D stacked semiconductor structure according to claim 1, wherein the first conductors and the second conductor are made from different conductive materials.

8. The 3D stacked semiconductor structure according to claim 1, further comprising a second region, wherein two of said adjacent receiving trenches on the multi-layered pillars in the second region are respectively filled with a first insulator and the second conductor.

9. The 3D stacked semiconductor structure according to claim 8, wherein the second region comprises a plurality of SSL portions, and two of said adjacent SSL portions are electrically isolated by a second insulator, and the second insulator is formed on the first insulator.

10. The 3D stacked semiconductor structure according to claim 1, further comprising a second region, and two of said adjacent receiving trenches on the multi-layered pillars in the second region respectively filled with a first insulator.

11. The 3D stacked semiconductor structure according to claim 10, further comprising:
    a second insulator formed on the first conductors positioned between the multi-layered pillars and on the first insulator on the multi-layered pillars in the second region;
    a dielectric layer formed on the second insulator; and
    a plurality of SSL contacts penetrating through the dielectric layer, the second insulator and the first insulator.

12. The 3D stacked semiconductor structure according to claim 11, wherein each of the SSL contacts connects one of the first conductors and touch partial top surface of a top insulating layer of the multi-layered pillar in the second region.

\* \* \* \* \*